US010491011B2

(12) United States Patent
Uchida

(10) Patent No.: US 10,491,011 B2
(45) Date of Patent: Nov. 26, 2019

(54) LITHIUM ION SECONDARY BATTERY CAPACITY RESTORATION SYSTEM

(71) Applicant: TOYOTA JIDOSHA KABUSHIKI KAISHA, Toyota-shi, Aichi-ken (JP)

(72) Inventor: Masatoshi Uchida, Toyota (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 141 days.

(21) Appl. No.: 15/723,716

(22) Filed: Oct. 3, 2017

(65) Prior Publication Data

US 2018/0109121 A1   Apr. 19, 2018

(30) Foreign Application Priority Data

Oct. 14, 2016  (JP) ................. 2016-202562

(51) Int. Cl.
| | | |
|---|---|---|
| *H02J 7/00* | (2006.01) | |
| *G06N 5/04* | (2006.01) | |
| *H01M 2/10* | (2006.01) | |
| *H01M 10/0525* | (2010.01) | |
| *H01M 10/42* | (2006.01) | |

(Continued)

(52) U.S. Cl.
CPC ............ *H02J 7/0021* (2013.01); *B60L 58/12* (2019.02); *B60L 58/13* (2019.02); *B60L 58/21* (2019.02); *G01R 31/392* (2019.01); *G06N 5/04* (2013.01); *H01M 2/1077* (2013.01); *H01M 10/0525* (2013.01); *H01M 10/425* (2013.01); *H01M 10/48* (2013.01); *H01M 10/052* (2013.01); *H01M 10/482* (2013.01); *H01M 10/486* (2013.01); *H01M 2010/4271* (2013.01); *H01M 2010/4278* (2013.01); *H01M 2220/20* (2013.01); *Y02E 60/122* (2013.01)

(58) Field of Classification Search
CPC ...................................................... H02J 7/0021
USPC ........................................................ 320/134
See application file for complete search history.

(56) References Cited

U.S. PATENT DOCUMENTS

| | | | |
|---|---|---|---|
| 10,006,967 B2 * | 6/2018 | Ganesan ............... | H02J 7/0021 |
| 2014/0225571 A1 | 8/2014 | Obata et al. | |

(Continued)

FOREIGN PATENT DOCUMENTS

| | | | | |
|---|---|---|---|---|
| JP | 2012-028024 A | | 2/2012 | |
| JP | 2012-195161 | * | 10/2012 | ............ H01M 10/42 |

(Continued)

*Primary Examiner* — Edward Tso
*Assistant Examiner* — Ahmed H Omar
(74) *Attorney, Agent, or Firm* — Sughrue Mion, PLLC

(57) ABSTRACT

A capacity restoration system restores a capacity of a battery pack including lithium ion secondary batteries and mounted on a vehicle. The capacity restoration system includes a capacity restoration device, a communication device, and a server. The capacity restoration device is configured to perform a restoration process to restore a capacity of the battery pack by maintaining a SOC of the battery pack to be equal to or less than a reference value. The communication device is configured to acquire restoration data. The restoration data includes: the reference value for the SOC, the reference value being used for the restoration process; and a capacity restoration ratio attained by the restoration process. The server is configured to use the restoration data to calculate the reference value used for the restoration process for a target vehicle.

9 Claims, 12 Drawing Sheets

(51) Int. Cl.
  *H01M 10/48* (2006.01)
  *G01R 31/392* (2019.01)
  *B60L 58/12* (2019.01)
  *B60L 58/13* (2019.01)
  *B60L 58/21* (2019.01)
  *H01M 10/052* (2010.01)

(56) References Cited

U.S. PATENT DOCUMENTS

| | | | | |
|---|---|---|---|---|
| 2014/0300324 A1* | 10/2014 | Kikuchi | ................ | H01M 10/44 320/116 |
| 2016/0003918 A1* | 1/2016 | Wada | ........................ | H02J 3/32 320/134 |

FOREIGN PATENT DOCUMENTS

| | | | |
|---|---|---|---|
| JP | 2012-195161 A | 10/2012 | |
| JP | 2015-187938 A | 10/2015 | |
| KR | 10-2014-0066729 A | 6/2014 | |
| WO | 2013/046263 A1 | 4/2013 | |

\* cited by examiner

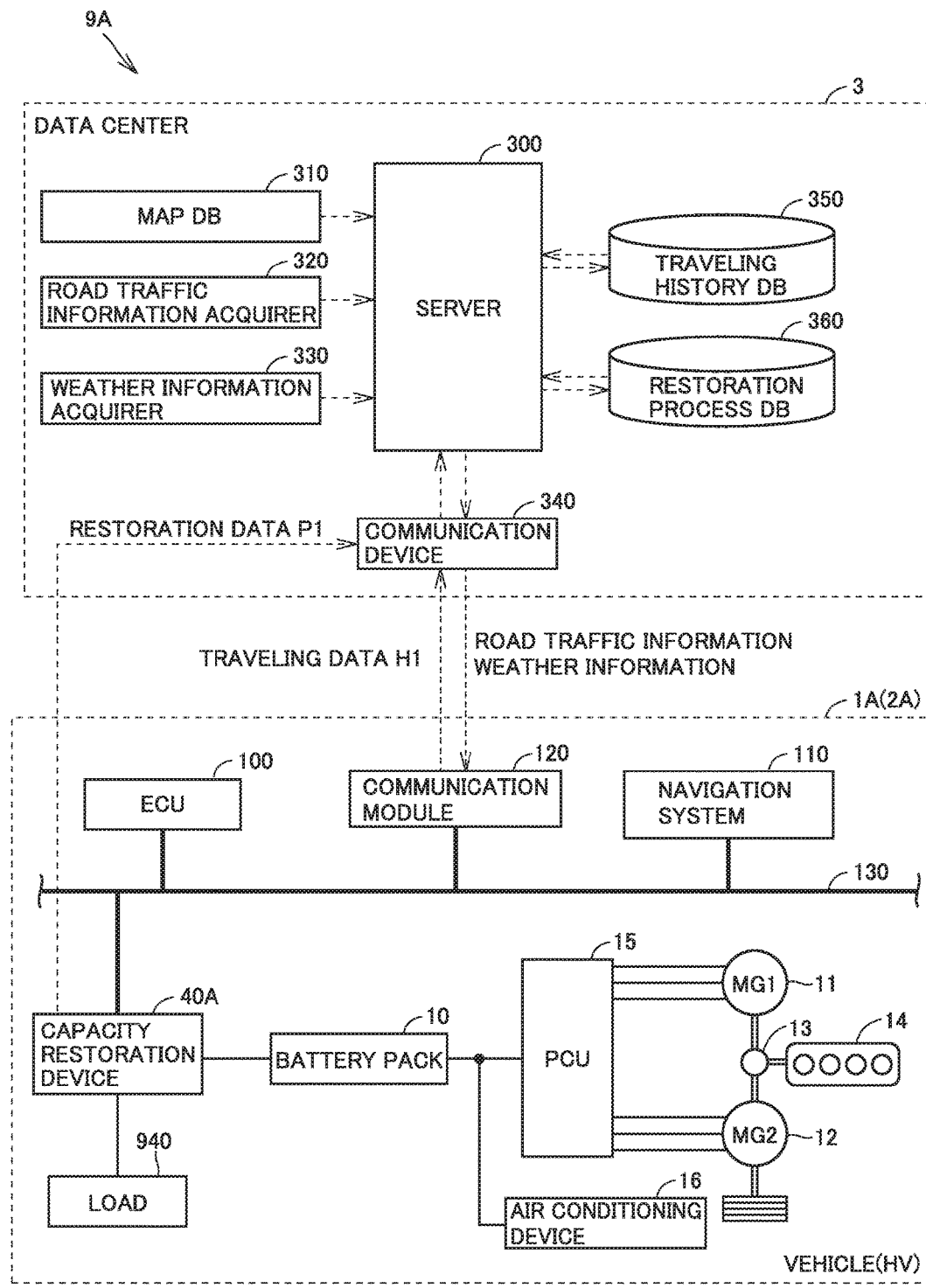

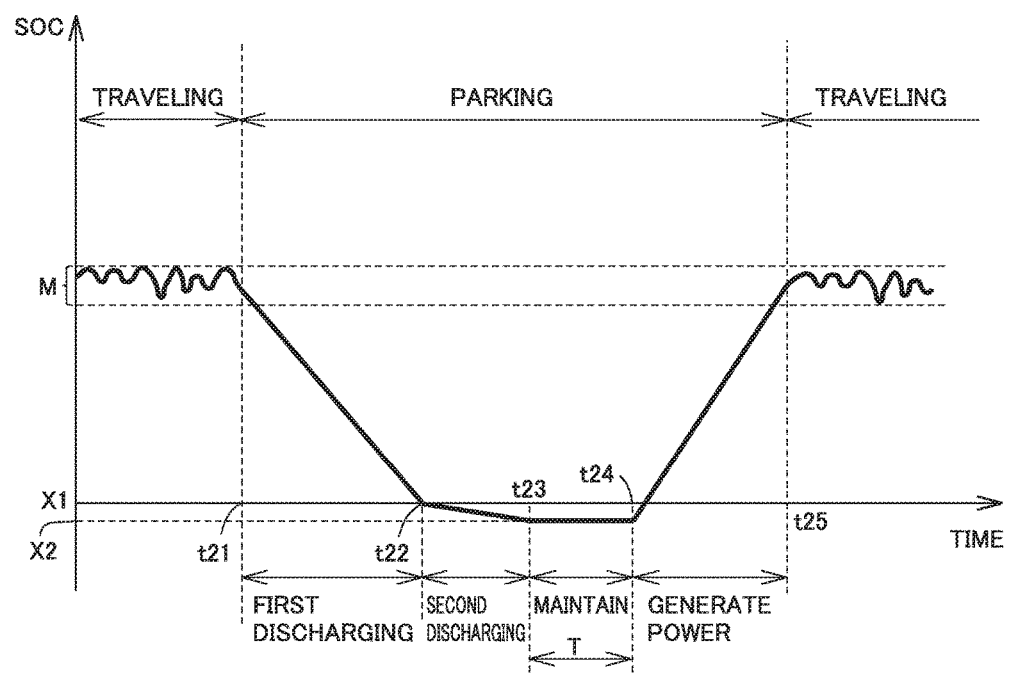

FIG.11

```
DATA CENTER                    CAPACITY RESTORATION DEVICE
  ( START )                           ( START )
                                           │
                         ┌─────────────────▼──────────────────────┐
                         │ FIRST        YES ◄─────────────────┐   │
                         │ DISCHARGING   ╱╲      S220         │   │
                         │              ╱  ╲                  │   │
                         │             ╱SOC ╲   NO    ┌───S222┴─┐ │
                         │            ╱ ≤X1? ╲──────► │CONSUME  │ │
                         │             ╲    ╱         │POWER OF │ │
                         │              ╲  ╱          │BATTERY  │ │
                         │               ╲╱           │PACK     │ │
                         │              YES           └─────────┘ │
                         └────────────────┬───────────────────────┘
                                          │
        X2 REQUEST +Tb  ┌─SECOND DISCHARGING▼────S230─────────┐
     ◄──────────────────│  REQUEST REFERENCE VALUE X2         │
┌──────────┐  X2        │                ▼          S232      │
│CALCULATE │- - - - - - ▶│  DISCHARGE BATTERY                 │
│ X2       │            │   PACK UNTIL SOC = X2               │
│   S290   │            └──────────────────┬──────────────────┘
└──────────┘                               ▼         S234
                         ┌─────────────────────────────────────┐
                         │ ACQUIRE VOLTAGE AND CURRENT         │
                         │ DURING DISCHARGING                  │
                         └─────────────────┬───────────────────┘
                                           ▼         S236
                         ┌─────────────────────────────────────┐
                         │ CALCULATE PRE-RESTORATION           │
                         │ CAPACITY C1                         │
                         └─────────────────┬───────────────────┘
                                           ▼         S238
                         ┌─────────────────────────────────────┐
                         │ MAINTAIN SOC ≤ X2                   │
                         └─────────────────┬───────────────────┘
                                           ▼         S240
                         ┌─────────────────────────────────────┐
                         │ GENERATE POWER UNTIL SOC            │
                         │ FALLS WITHIN RANGE M                │
                         └─────────────────┬───────────────────┘
                                           ▼         S250
                         ┌─────────────────────────────────────┐
                         │ ACQUIRE VOLTAGE AND CURRENT         │
                         │ DURING CHARGING                     │
                         └─────────────────┬───────────────────┘
                                           ▼         S252
                         ┌─────────────────────────────────────┐
                         │ CALCULATE POST-RESTORATION          │
                         │ CAPACITY C2                         │
                         └─────────────────┬───────────────────┘
              R                            ▼         S254
     ◄────────────────── │ CALCULATE CAPACITY RESTORATION      │
     ┌────S292┐          │ RATIO R (= C2/C1)                   │
     │ACCUMU- │          └─────────────────┬───────────────────┘
     │LATE R  │                            ▼         S256
     └────┬───┘          ┌─────────────────────────────────────┐
          │              │ PRESENT RESTORATION AMOUNT OF       │
          │              │ EV TRAVEL PERMITTED DISTANCE        │
          ▼              └─────────────────┬───────────────────┘
     ( RETURN )                       ( RETURN )
```

LITHIUM ION SECONDARY BATTERY CAPACITY RESTORATION SYSTEM

This nonprovisional application is based on Japanese Patent Application No. 2016-202562 filed on Oct. 14, 2016, with the Japan Patent Office, the entire contents of which are hereby incorporated by reference.

BACKGROUND

Field

The present disclosure relates to a lithium ion secondary battery capacity restoration system, more particularly, a capacity restoration system for restoring a capacity of a battery pack including lithium ion secondary batteries and mounted on a vehicle.

Description of the Background Art

In recent years, electrically powered vehicles each having a battery pack including lithium ion secondary batteries have been pervasive. Generally, the full charge capacity (hereinafter, simply referred to as "capacity") of an in-vehicle battery pack including lithium ion secondary batteries is decreased due to, for example, expiration of service period or repeated charging/discharging with a large amount of current. As a result, in each of such electrically powered vehicles, an EV traveling distance becomes short. In many cases, such an in-vehicle battery pack is used for a long period of time (for example, ten years or more). Hence, a demand arises in a technique of restoring the decreased capacity.

For example, Japanese Patent Laying-Open No. 2012-195161 discloses a method of restoring a capacity of a battery pack including lithium ion secondary batteries. Japanese Patent Laying-Open No. 2012-195161 discloses that a capacity of a battery pack is restored by maintaining a state of charge (SOC) of the battery pack to be low (for example, SOC of 30% or less) for a long period of time (for example, several hours to several hundred hours) (see FIG. 5 to FIG. 9 of Japanese Patent Laying-Open No. 2012-195161).

SUMMARY

More specifically, according to Japanese Patent Laying-Open No. 2012-195161, the capacity of the battery pack is restored by discharging the battery pack until the SOC of the battery pack reaches a reference SOC (restoration process reference SOC in Japanese Patent Laying-Open No. 2012-195161) and maintaining the SOC of the battery pack to be equal to or less than the reference SOC. A capacity restoration amount of the battery pack (capacity restoration ratio D in Japanese Patent Laying-Open No. 2012-195161) can differ depending on the reference SOC. In Japanese Patent Laying-Open No. 2012-195161, the reference SOC is determined in advance based on a result of capacity restoration test previously conducted.

However, such a capacity restoration test can be conducted only under a limited condition that can be reproduced in a laboratory. Meanwhile, in order to set the reference SOC based on an actual operation condition, it can be considered to collect and analyze battery packs having been introduced to the market and having been actually used; however, there is a limitation in the number of samples that can be collected. Hence, it is difficult to secure a sufficient number of samples. Therefore, the reference SOC determined in advance based on the capacity restoration test or the like may not be an optimum value, and there may be a reference SOC allowing for a larger capacity restoration amount. Regarding this point, there is room for improvement in the capacity restoration method disclosed in Japanese Patent Laying-Open No. 2012-195161.

The present disclosure has been to solve the above-described problem, and has an object to provide a technique of effectively restoring a capacity of a battery pack including lithium ion secondary batteries and mounted on an electrically powered vehicle.

A lithium ion secondary battery capacity restoration system according to a certain aspect of the present disclosure restores a capacity of a battery pack including lithium ion secondary batteries and mounted on a vehicle. The lithium ion secondary battery capacity restoration system includes: a capacity restoration device, a data acquisition device, and a calculation device. The capacity restoration device is configured to perform a restoration process to restore a capacity of the battery pack by maintaining a SOC of the battery pack to be equal to or less than a reference SOC. The data acquisition device is configured to acquire restoration data including the reference SOC used for the restoration process and a capacity restoration amount attained by the restoration process. The calculation device is configured to calculate a target reference SOC using the restoration data, the target reference SOC being the reference SOC used for the restoration process for a target vehicle.

According to the above-described configuration, the restoration data acquired from the plurality of vehicles are used to calculate the reference SOC (target reference SOC) for the restoration process for the target vehicle. In other words, the restoration data of the plurality of actually used battery packs are acquired (for example, collected), and the reference SOC is calculated based on the acquired restoration data. Therefore, as compared with a case where the reference SOC is calculated based on results of capacity restoration tests conducted in advance under limited conditions, it is possible to calculate a reference SOC allowing for a larger capacity restoration amount. Therefore, the capacity of the battery pack can be restored more effectively.

Preferably, the data acquisition device is further configured to acquire a traveling history of each of the plurality of vehicles and a temperature of the battery pack during execution of the restoration process. The calculation device is configured to calculate the target reference SOC using the traveling history of each of the plurality of vehicles and the temperature of the battery pack in addition to the restoration data.

According to the above-described configuration, for the calculation of the reference SOC (target reference SOC), the traveling history of each of the plurality of vehicles, and the temperature of the battery pack are further used in addition to the restoration data. In accordance with the respective traveling histories of the vehicles, the states of the battery packs mounted on the vehicles (the use history or degree of deterioration of the battery packs) can differ. Moreover, the temperature of the battery pack during the execution of the restoration process is a major parameter that has an influence over the effect of the restoration process (magnitude of the capacity restoration amount). Hence, in consideration of the past use history of the battery pack and temperature condition upon the execution of the restoration process, the reference SOC suitable for the target vehicle can be calculated more precisely. Therefore, the capacity of the battery pack can be restored more effectively.

Preferably, the calculation device is configured to extract a regularity established among the traveling history of each of the plurality of vehicles, the temperature of the battery pack, the reference SOC, and the capacity restoration amount, and is configured to calculate the target reference SOC according to the traveling history of the target vehicle and the temperature of the battery pack of the target vehicle based on the extracted regularity.

According to the above-described configuration, the regularity is extracted from the actual traveling history of each of the plurality of vehicles, the temperature of the battery pack when actually performing the restoration process under various conditions, the reference SOC, and the capacity restoration amount. In other words, the reference SOC (target reference SOC) to be used for the restoration process for the target vehicle is calculated by performing a so-called data mining analysis to the big data. Therefore, a more appropriate value can be calculated as the target reference SOC, thereby restoring the capacity of the battery pack more effectively.

Preferably, the calculation device is configured to calculate the target reference SOC such that the capacity restoration amount after the execution of the restoration process becomes equal to or more than a predetermined amount.

According to the above-described configuration, the target reference SOC is calculated such that the capacity restoration amount (predicted value of the capacity restoration amount) after the execution of the restoration process to the target vehicle becomes equal to or more than the predetermined amount (for example, becomes maximum). Therefore, the capacity of the battery pack can be restored more effectively.

Preferably, the calculation device is configured to use the restoration data to predict the capacity restoration amount to be attained when the restoration process is performed to the target vehicle. The capacity restoration device is configured to perform the restoration process to the target vehicle when the predicted capacity restoration amount is equal to or more than a criteria amount, and is configured not to perform the restoration process to the target vehicle when the predicted capacity restoration amount is less than the criteria amount.

When the restoration process is performed, the SOC is maintained to be equal to or less than the reference SOC for a certain period of time (for example, several hours to several days). Hence, during such a period of time, the vehicle cannot be used or the performance of the vehicle cannot be fully exhibited. On the other hand, for example, depending on the state of the battery pack such as a state in which the deterioration of the battery pack is not developed much, a sufficient capacity restoration amount may not be obtained even if the restoration process is performed. According to the above-described configuration, whether or not the predicted capacity restoration amount becomes equal to or more than the criteria amount is determined in advance using the restoration data. Accordingly, the restoration process can be performed at an appropriate timing at which a sufficient capacity restoration amount is obtained.

Preferably, the traveling history of each of the plurality of vehicles includes at least one of a traveling path, a traveling distance, and speed and acceleration of each of the plurality of vehicles.

The travel path, traveling distance, speed, and acceleration (inclusive of deceleration) of the electrically powered vehicle are major parameters that have an influence over charging/discharging (and deterioration of the battery pack due to the charging/discharging) of the battery pack. For example, as the traveling distance becomes longer or a large acceleration is caused more frequently, the battery pack is more likely to be charged and discharged, with the result that the deterioration of the battery pack is more likely to be developed. According to the above-described configuration, in consideration of such a traveling history, the state (degree of development of deterioration of the battery pack) of the battery pack is reflected more accurately and a more appropriate value can be calculated as the target reference SOC. Therefore, the capacity of the battery pack can be restored more effectively.

Preferably, the lithium ion secondary battery capacity restoration system further includes a notifier. The notifier is mounted on the target vehicle and is configured to notify the capacity restoration amount after the execution of the restoration process to a user of the target vehicle.

According to the above-described method, the user is notified of the capacity restoration amount, and can accordingly know the effect of the restoration process.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 9 shows a configuration of a capacity restoration system in a second embodiment.

FIG. 10 is a time chart for illustrating the restoration process in the second embodiment.

FIG. 11 is a flowchart showing the restoration process in the second embodiment.

DESCRIPTION OF THE PREFERRED EMBODIMENTS

Figure 1:
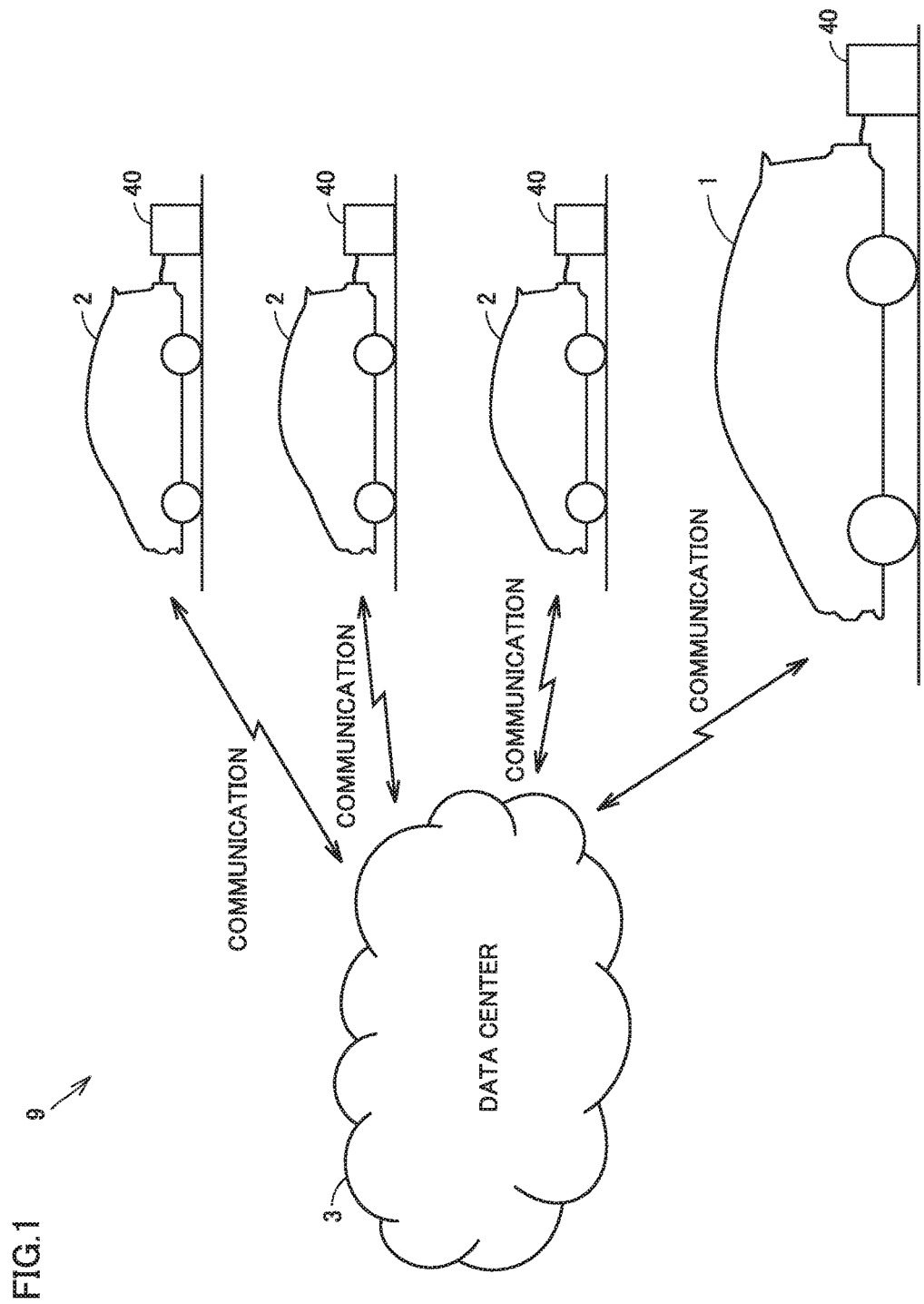
FIG. 1 schematically shows an entire configuration of a lithium ion secondary battery capacity restoration system according to a first embodiment.

The following describes embodiments of the present disclosure with reference to figures in detail. It should be noted that the same or corresponding portions in the figures are given the same reference characters and are not described repeatedly.

In the present disclosure, the term "vehicle" means a hybrid vehicle, a plug-in hybrid vehicle, an electric vehicle, and a fuel cell vehicle.

In the present disclosure, the term "EV traveling distance" means a distance in which an electrically powered vehicle can travel until power stored in a battery pack is consumed to a defined amount. The EV traveling distance includes a maximum distance in which the electrically powered vehicle can travel when the amount of power is maximum (SOC=100%), but is not limited to this. The EV traveling distance can include a distance in which the electrically powered vehicle can travel until an amount of power at a certain point of time is consumed to the defined amount.

First Embodiment

<Configuration of Capacity Restoration System>

FIG. 1 schematically shows an entire configuration of a lithium ion secondary battery capacity restoration system according to a first embodiment. A capacity restoration system 9 includes: a capacity restoration device 40 connected to a vehicle 1 (target vehicle) of a user (not shown); a capacity restoration device 40 connected to each of a plurality of vehicles 2; and a data center 3. In the first embodiment, each of vehicle 1 and the plurality of vehicles 2 is a plug-in hybrid vehicle. It should be noted that vehicle 1 and the plurality of vehicles 2 correspond to a "plurality of vehicles" according to the present disclosure.

Vehicle 1 and data center 3 are configured to communicate with each other. Likewise, each of the plurality of vehicles 2 and data center 3 are also configured to communicate with each other. Although details will be described later, data center 3 collects and stores: traveling data and restoration data of vehicle 1; and traveling data and restoration data of each of the plurality of vehicles 2.

In the first embodiment, the following describes an example in which vehicle 1 is handed over to a dealer and is subjected to a process (hereinafter, also referred to as "restoration process") performed by an operator of the dealer to restore the capacity of battery pack 10. However, a location in which the restoration process is performed is not particularly limited. For example, in a parking space of the user's house, the restoration process may be performed before performing external charging using power supplied from an external power supply (not shown).

Figure 2:
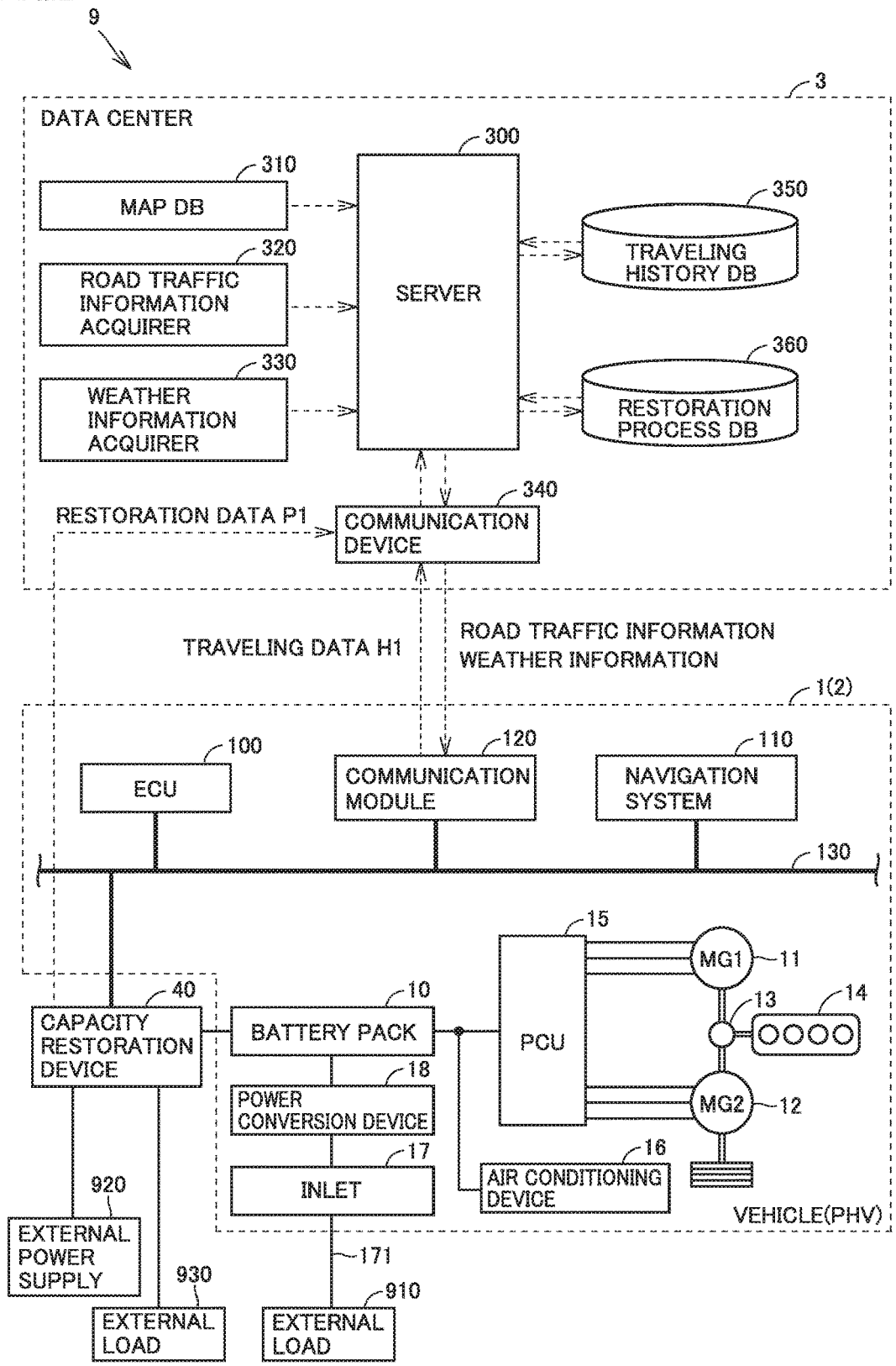
FIG. 2 shows the configuration of the capacity restoration system during execution of a restoration process more in detail.

FIG. 2 shows the configuration of capacity restoration system 9 more in detail. Since each of the plurality of vehicles 2 has basically the same configuration as that of vehicle 1, FIG. 2 representatively shows the configuration of vehicle 1.

Vehicle 1 includes: a battery pack 10; motor generators (MG) 11, 12; a power split device 13; an engine 14; a power control unit (PCU) 15; an air conditioning device 16; an inlet 17; and a power conversion device 18. Further, a capacity restoration device 40 is connected to vehicle 1 as a configuration for performing the restoration process for battery pack 10.

Battery pack 10 is a battery pack including lithium ion secondary batteries. The configuration of battery pack 10 will be described later more in detail with reference to FIG. 3 and FIG. 4.

Each of motor generators 11, 12 is a three-phase AC rotating electrical machine, for example. Motor generator 11 is connected to a crankshaft of an engine 14 via a power split device 13. When starting engine 14, motor generator 11 uses electric power of battery pack 10 to rotate the crankshaft of engine 14. Moreover, motor generator 11 is also capable of generating electric power using motive power of engine 14. The AC power generated by motor generator 11 is converted into DC power by PCU 15 to charge battery pack 10. Moreover, the AC power generated by motor generator 11 may be supplied to motor generator 12.

Motor generator 12 rotates the driving shaft using at least one of electric power stored in battery pack 10 and electric power generated by motor generator 11. Moreover, motor generator 12 can also generate electric power by way of regenerative braking. The AC power generated by motor generator 12 is converted into DC power by PCU 15 to charge battery pack 10.

PCU 15 includes an inverter and an converter (both not shown), and is configured to convert electric power among battery pack 10, motor generator 11, and motor generator 12. Air conditioning device 16 is an electrically powered air conditioner, and performs air conditioning in a passenger compartment (not shown) of vehicle 1 using electric power supplied from battery pack 10.

Inlet 17 is configured to permit a plug (not shown) of a power cable 171 to be coupled thereto. Power cable 171 is used to supply power from an external power supply (not shown) of vehicle 1 to store the power in battery pack 10, and is used to supply power stored in battery pack 10 to an external load 910 (electric device or the like that consumes power) of vehicle 1. Power conversion device 18 is configured to convert the voltage of the power supplied from the external power supply into a voltage suitable to store the power in battery pack 10, and is configured to convert the voltage of the power stored in battery pack 10 into a voltage that can be used by external load 910.

Vehicle 1 further includes an electronic control unit (ECU) 100, a navigation system 110, and a communication module 120. ECU 100, navigation system 110, and communication module 120 are connected to one another via an in-vehicle LAN (Local Area Network) 130.

ECU 100 is configured to include a CPU (Central Processing Unit), a memory (ROM (Read Only Memory) and RAM (Random Access Memory)), and an input/output buffer (each not shown). ECU 100 is configured to control each of the devices (PCU 15, air conditioning device 16, power conversion device 18, and the like) to bring vehicle 1 into a desired state. Moreover, ECU 100 is configured to monitor the voltage, current, and temperature of battery pack 10 and control charging/discharging of battery pack 10. Moreover, ECU 100 is configured to estimate the SOC of battery pack 10 based on a result of the monitoring of battery pack 10.

Vehicle 1 is configured to communicate with data center 3 via communication module 120. Vehicle 1 transmits, to data center 3, identification information including a vehicle type of vehicle 1, and traveling data (hereinafter, also referred to as "data H1") of vehicle 1 (described later). Moreover, vehicle 1 is capable of receiving road traffic information (information regarding traffic jam, accident, traffic restriction, and the like) or weather information (information regarding weather, temperature, and the like) from data center 3 via communication module 120.

Navigation system 110 includes a storage, a GPS (Global Positioning System) receiver, a traveling state detector, a computer, and a display operation portion (each not shown).

The storage stores: road map data; and facility data accompanied therewith, such as various shops, for example. The GPS receiver specifies the present location of vehicle 1 based on electric waves from satellites. The traveling state detector includes a gyroscope and a geomagnetic field sensor to detect the traveling state of vehicle 1, for example. The computer calculates the present location, traveling direction, speed, and the like of vehicle 1 based on a signal from each sensor included in the GPS receiver and the traveling state detector. The display operation portion includes a navigation screen provided with a touch panel, presents various types of information, and accepts an operation from the user.

In navigation system 110, data H1 indicating a travel history of actual past traveling of vehicle 1 is stored in the storage. Data H1 includes: information indicating a traveling path of vehicle 1 (more specifically, data in which the traveling path of vehicle 1 is divided into a plurality of sections with traffic intersections or the like being as nodes and intervals between the nodes are defined as links); and information indicating an operation state (speed or the like) of vehicle 1 in each link. Data H1 stored in the storage is transmitted to data center 3 via communication module 120 regularly or when a predetermined condition is satisfied. Data center 3 includes a server 300, a map database 310, a road traffic information acquirer 320, a weather information acquirer 330, a communication device 340, a traveling history database 350, and a restoration process database 360.

Map database 310 stores road map data. Road traffic information acquirer 320 acquires latest road traffic information provided from a road traffic information center, for example. Weather information acquirer 330 acquires latest weather information provided from the Meteorological Agency, for example. Communication device 340 is configured to communicate with communication module 120 and capacity restoration device 40 mounted on vehicle 1, in order to acquire various types of data. It should be noted that communication device 340 corresponds to a "data acquisition device" according to the present disclosure.

Traveling history database 350 stores: data H1 transmitted from vehicle 1; and traveling data (hereinafter, also referred to as "data H2") transmitted from each of the plurality of vehicles 2. Data H2 includes the same type of information as that of data H1 and is therefore not described in detail repeatedly.

Although details will be described later, restoration process database 360 stores: restoration data (hereinafter, also referred to as "data P1") transmitted from capacity restoration device 40 connected to vehicle 1; and restoration data (hereinafter, also referred to as "data P2") transmitted from a capacity restoration device (not shown) connected to each of the plurality of vehicles 2. Each of data P1, P2 includes: information indicating temperature Tb and reference value X2 of battery pack 10, each of which is a condition for execution of the restoration process; and information indicating a capacity restoration ratio R, which is a restoration process result (details will be described with reference to FIG. 6).

Server (calculation device) 300 is configured to include a CPU, a memory, and an input/output buffer (each not shown). Server 300 stores (accumulates), in traveling history database 350, data H1 received from vehicle 1 and data H2 received from each of the plurality of vehicles 2. Moreover, server 300 stores (accumulates), in restoration process database 360, data P1 received from capacity restoration device 40 connected to vehicle 1 and data P2 received from the capacity restoration device connected to each of the plurality of vehicles 2. Details of the data stored in traveling history database 350 and restoration process database 360 will be described later with reference to FIG. 7.

Capacity restoration device 40 is configured to communicate with data center 3 via a communication module (not shown). Moreover, capacity restoration device 40 is connected to in-vehicle LAN 130, and is configured to communicate with ECU 100. However, it is not essential that communication can be made between capacity restoration device 40 and ECU 100. Capacity restoration device 40 is electrically connected to an external power supply 920 (for example, system power supply) and an external load 930 (device that consumes power).

Figure 3:
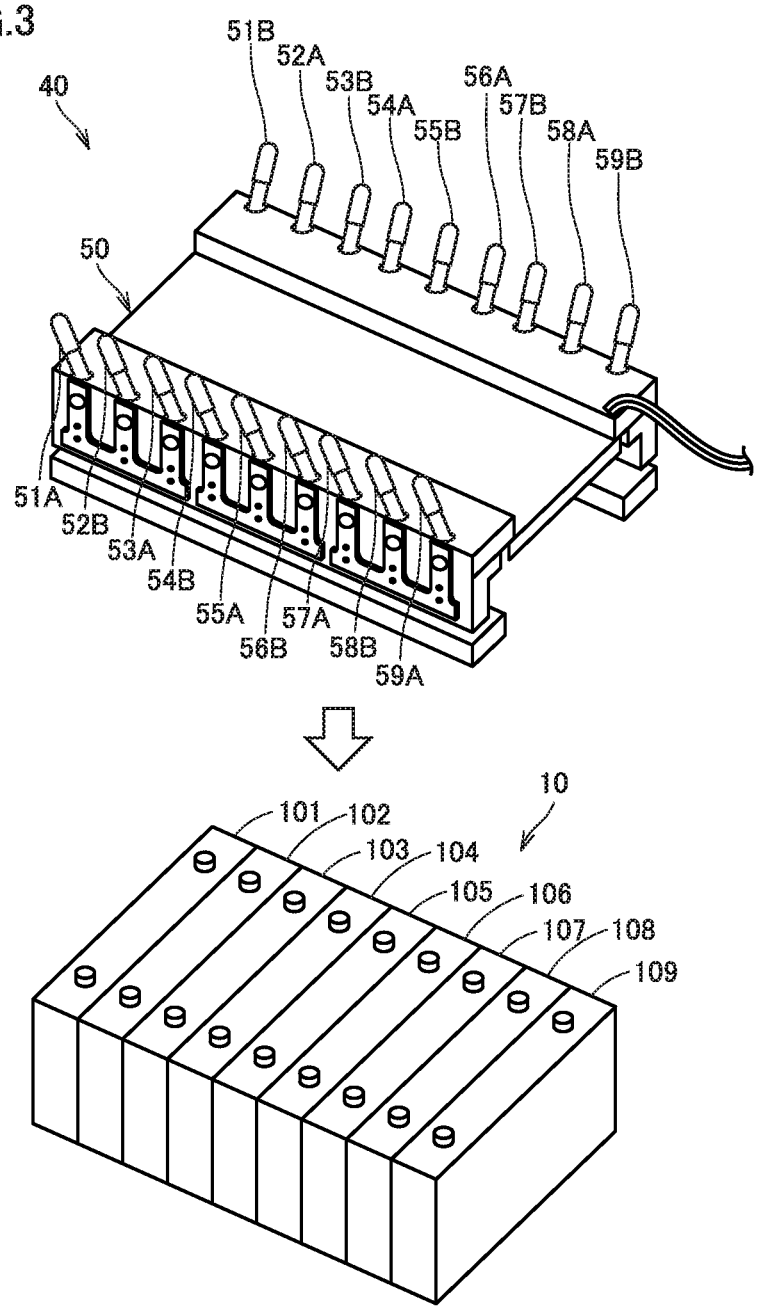
FIG. 3 is a diagram showing an external appearance of a capacity restoration device.
Figure 4:
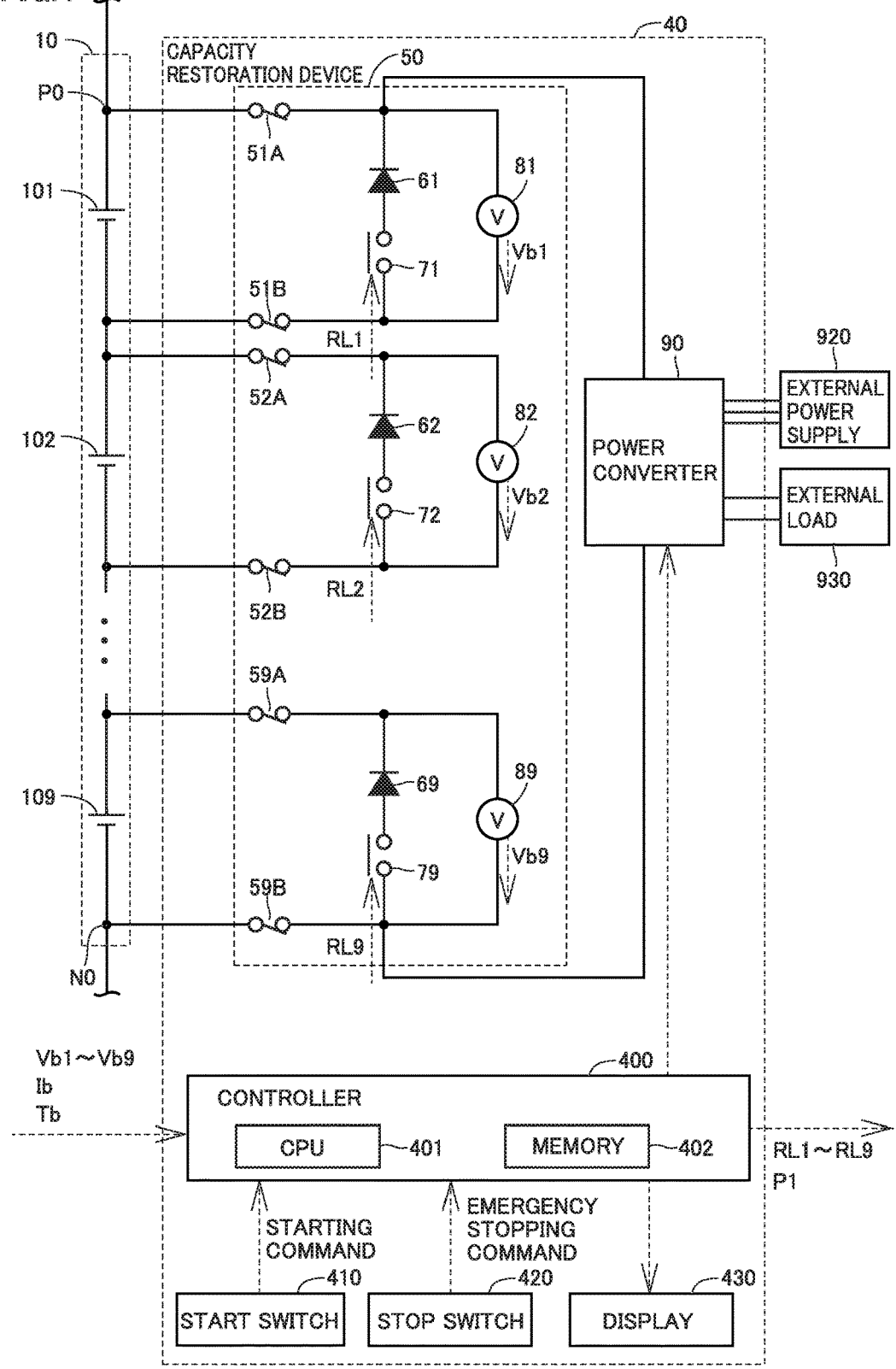
FIG. 4 is a circuit block diagram showing the configuration of the capacity restoration device.

FIG. 3 shows an external appearance of capacity restoration device 40. FIG. 4 is a circuit block diagram of capacity restoration device 40. In order to avoid complicatedness in drawings, in the first embodiment, it is assumed that nine cells are included in battery pack 10; however, the number of cells is not limited particularly. Generally, an in-vehicle battery pack includes about several ten cells to one hundred and several ten cells.

Capacity restoration device 40 includes a connection jig 50 attachable to battery pack 10 through a manual operation by an operator of the dealer (not shown). FIG. 3 shows an exploded perspective view of battery pack 10 and connection jig 50 attached to the upper surface of battery pack 10 (state in which connection jig 50 is detached from battery pack 10).

Battery pack 10 is constructed of a plurality of cells 101 to 109 each having a prismatic shape and stacked on one another. Battery pack 10 has a rectangular parallelepiped shape. Connection jig 50 has a substantially rectangular parallelepiped shape with an open bottom so as to correspond to the shape of battery pack 10. On one side surface of connection jig 50, clamps 51A, 52B to 58B, 59A are arranged. On the other side surface of connection jig 50, clamps 51B, 52A to 58A, 59B are arranged. Each of the clamps is a toggle clamp, for example. Moreover, connection jig 50 is provided with a substrate (not shown) on which each of below-described components is mounted.

With reference to FIG. 4, the plurality of cells 101 to 109 are connected in series between a positive electrode node P0 of battery pack 10 and a negative electrode node N0 of battery pack 10. Connection jig 50 is further provided with a plurality of diodes 61 to 69, a plurality of relays 71 to 79, and a plurality of voltage sensors 81 to 89. Respective circuit configurations provided corresponding to cells 101 to 109 are the same. Therefore, hereinafter, a circuit configuration corresponding to cell 101 will be described representatively.

Clamp 51A is connected to a positive electrode terminal side of cell 101, and clamp 51B is connected to a negative electrode terminal side of cell 101.

Diode 61 and relay 71 are connected in series between clamp 51A and clamp 51B. Diode 61 has a cathode connected to clamp 51A. Diode 61 has an anode connected to one end of relay 71. The other end of relay 71 is connected to clamp 51B. Relay 71 is opened or closed in response to a control signal RL1 from controller 400. When cell 101 is permitted to be discharged, relay 71 is opened. When cell 101 is prohibited to be discharged, relay 71 is closed. It should be noted that relay 71 may be connected to the cathode side of diode 61.

Voltage sensor 81 detects voltage Vb1 of cell 101, and sends a detection result thereof to controller 400. In the description below, voltage Vb1 of cell 101 to voltage Vb9 of cell 109 are also referred to as "voltage Vb" when they are not particularly distinguished from one another. It should be noted that controller 400 acquires, from a current sensor (not shown) provided in battery pack 10, current Ib flowing in battery pack 10. Moreover, controller 400 acquires temperature Tb of battery pack 10 from a temperature sensor (not shown) provided in battery pack 10.

Capacity restoration device 40 further includes a power converter 90, controller 400, a start switch 410, a stop switch 420, and a display 430. Power converter 90 is electrically connected to external power supply 920 and external load 930. It should be noted that in the first embodiment, external power supply 920 and external load 930 are provided outside vehicle 1.

Power converter 90 charges/discharges battery pack 10 in response to a control command from controller 400. For example, power converter 90, which includes a converter (not shown), converts AC power supplied from external power supply 920 into DC power, thereby charging battery pack 10. Moreover, for example, power converter 90, which includes an inverter (not shown), converts DC power stored in battery pack 10 into AC power and supplies it to external load 930, thereby discharging battery pack 10. It should be noted that the configurations of external power supply 920 and external load 930 are not particularly limited as long as battery pack 10 can be charged/discharged.

Controller 400 is configured to include a CPU 401, a memory 402, and an input/output buffer (not shown). Controller 400 is configured to control each component (relays 71 to 79 and power converter 90) of capacity restoration device 40 based on a signal received from each sensor as well as map and program stored in memory 402. Specifically, controller 400 monitors the voltage, current, and temperature of battery pack 10, and performs the restoration process for battery pack 10 based on a result of the monitoring. The restoration process will be described later in detail with reference to FIG. 5 to FIG. 9.

In response to an operation by the operator of the dealer, start switch 410 outputs a command for starting the restoration process to controller 400. In response to an operation by the operator, stop switch 420 outputs, to controller 400, an emergency command for stopping charging/discharging battery pack 10 by power converter 90. When the emergency stop signal is received, controller 400 immediately stops the charging/discharging of battery pack 10.

Display (notifier) 430, such as a liquid crystal display, presents a result of the restoration process for battery pack 10 by controller 400. The operator checks display 430 to know a degree of restoration of the capacity of battery pack 10 after completion of the restoration process.

<Restoration Process>

Figure 5:
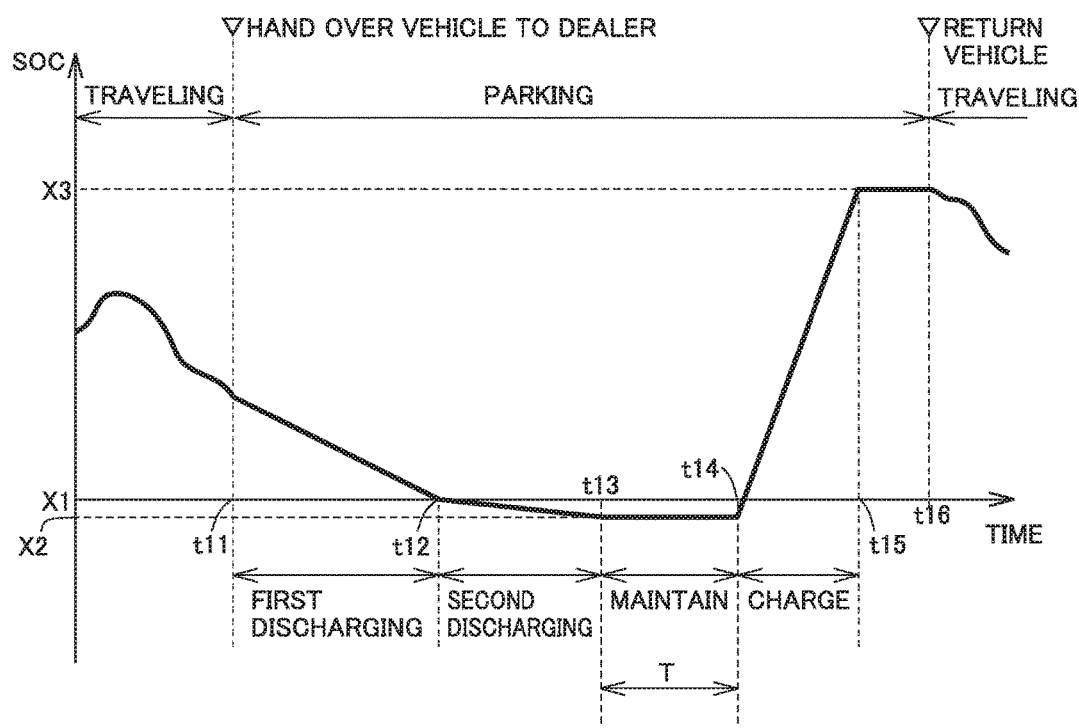
FIG. 5 is a time chart for illustrating the restoration process in the first embodiment.

FIG. 5 is a time chart for illustrating a restoration process in the first embodiment. In each of FIG. 5 and FIG. 10 below, the horizontal axis represents passage of time, whereas the vertical axis represents the SOC of battery pack 10.

Until a time t11, vehicle 1 travels normally. At time t11, the user hands over vehicle 1 to the dealer to request the restoration process for battery pack 10. At this point of time, power excessive for the restoration process is stored in battery pack 10. Therefore, a first discharging process is first performed to discharge power stored in battery pack 10 to external load 910 via inlet 17 and power cable 171.

When the SOC of battery pack 10 reaches a defined value X1 at a time t12, the first discharging process is stopped. Next, a second discharging process is performed to discharge power stored in battery pack 10 to external load 930 via capacity restoration device 40. Accordingly, the SOC of battery pack 10 is further decreased to a reference value X2. It should be noted that reference value X2 corresponds to a "reference SOC" according to the present disclosure.

It should be noted that the rated power of power converter 90 included in capacity restoration device 40 is smaller than the rated power of power conversion device 18. Therefore, the rate of discharging in the second discharging process is lower than the rate of discharging in the first discharging process. Hence, the first discharging process is not a process essential for the capacity restoration of battery pack 10, although FIG. 5 illustrates that the first discharging process is performed in order to reduce time taken for the SOC of battery pack 10 to be decreased to defined value X1.

Moreover, FIG. 5 illustrates that defined value X1 is 0 (SOC=0%) and reference value X2 is negative (SOC<0%); however, these are just exemplary because generally, in order for a SOC range used in normal driving of the vehicle to fall within a range of 0% to 100%, an OCV (Open Circuit Voltage) 1 corresponding to SOC=0% (for example, cell voltage=3.0 V) and an OCV2 corresponding to SOC=100% (for example, cell voltage=4.1 V) are set in an appropriately determined manner. Other values may be set as defined value X1 and reference value X2 as long as the following relation is satisfied: X2<X1≤30%. For example, reference value X2 may be 0 or a positive value (0≤X2<X1≤30%).

When the SOC of battery pack 10 reaches reference value X2 at a time t13, the second discharging process is stopped. Then, the voltage of battery pack 10 is adjusted to maintain the SOC of battery pack 10 to be equal to or less than reference value X2 (maintaining process). A period T for the maintaining process is a period required for restoration of the capacity of battery pack 10, and is preferably several hours to several days, for example.

With passage of period T at a time t14, it is assumed that the restoration of the capacity of battery pack 10 is completed and battery pack 10 starts to be charged for return of vehicle 1 to the user. This charging is performed until the SOC of battery pack 10 reaches a defined value X3 (time t15). Defined value X3 is preferably set at a value (for example, SOC=90%) close to the full charge state of battery pack 10. The dealer returns, to the user, vehicle 1 including battery pack 10 having the restored capacity, and the user starts traveling of vehicle 1 again (time t16).

As such, in the first embodiment, in the second discharging process and the maintaining process, the SOC state of battery pack 10 is maintained to be low (state in which the SOC is equal to or less than defined value X1 in the example shown in FIG. 5), thereby restoring the capacity of battery pack 10 (see Japanese Patent Laying-Open No. 2012-195161 and Japanese Patent Laying-Open No. 2015-187938). Particularly, the capacity restoration amount of battery pack 10 can be increased by decreasing the SOC of battery pack 10 to reference value X2 and maintaining this state for period T.

Here, reference value X2 appropriate to attain a sufficient capacity restoration amount when performing the restoration process to vehicle 1 can differ depending on a past traveling history (or degree of deterioration of battery pack 10) of vehicle 1. Moreover, appropriate reference value X2 can differ also depending on a condition in the restoration process (for example, temperature Tb of battery pack 10). It is considered to determine reference value X2 in advance by performing capacity restoration tests for battery packs under various conditions, or by collecting and analyzing battery packs having been introduced to the market and having been actually used. However, the capacity restoration tests can be conducted only under a limited condition that can be reproduced in a laboratory. On the other hand, there is a limitation in the number of samples of battery packs that can be collected. It is difficult to secure a sufficient number of samples. Therefore, there may be a reference value X2 allowing for a larger capacity restoration amount than that in the case where reference value X2 determined in advance is used.

In view of this, in the first embodiment, past traveling data (data H1) and restoration data (data P1) of vehicle 1 and past traveling data (data H2) and restoration data (data P2) of each of the plurality of vehicles 2 are collected and accumulated in data center 3, and accumulated data H1, H2, P1, P2 (so-called big data) are analyzed using a data mining technique. Then, the analysis result is verified against the past traveling data (data H1) of vehicle 1, thereby determining reference value X2 appropriate for the restoration process for battery pack 10 mounted on vehicle 1.

Figure 6:
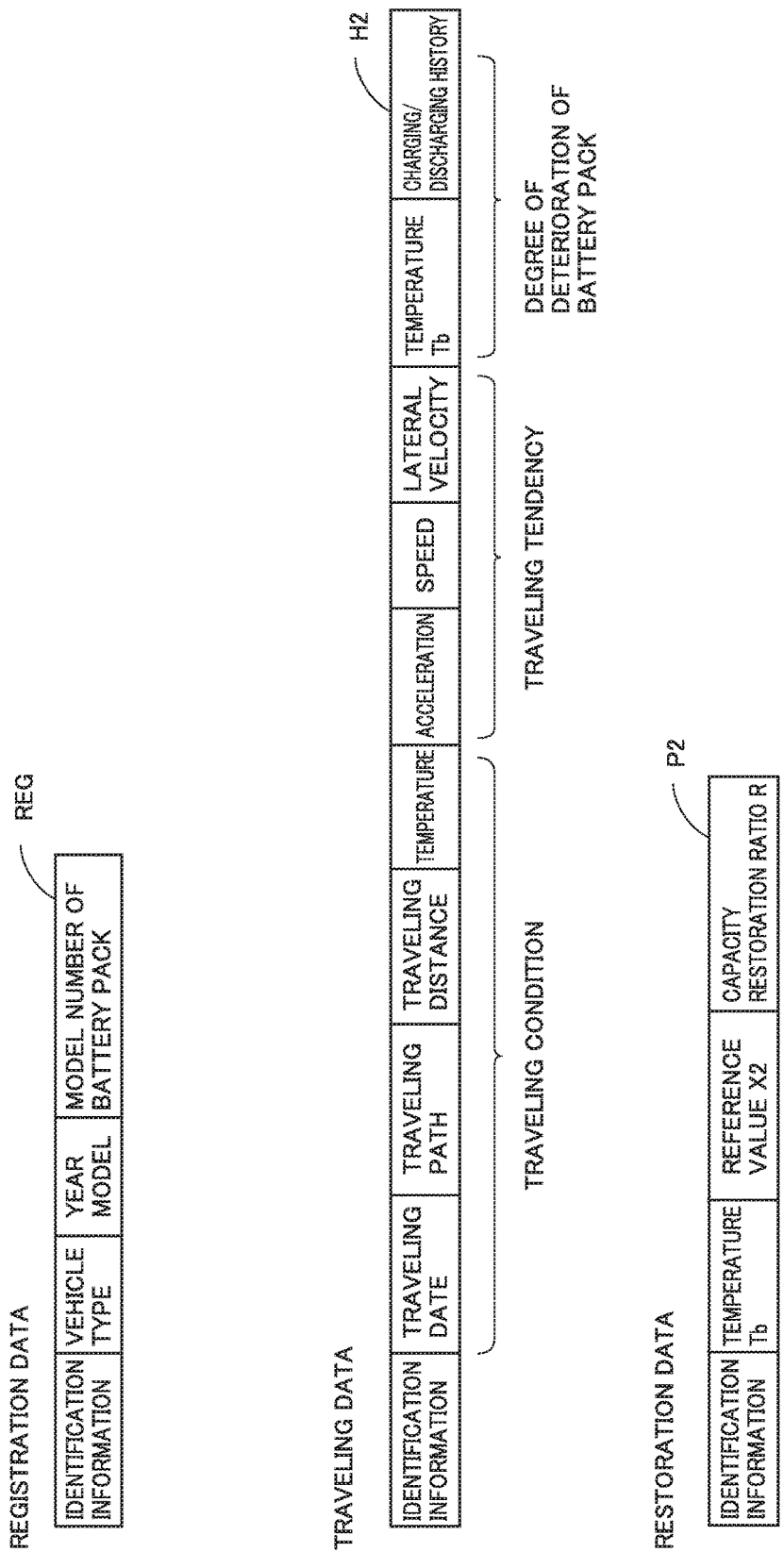
FIG. 6 is an explanatory diagram illustrating a data structure of each of various types of data in the first embodiment.

FIG. 6 is an explanatory diagram for illustrating data structures of various types of data in the present embodiment. Although FIG. 6 shows exemplary data structures of the various types of data for each of vehicles 2, the same applies to the various types of data for vehicle 1.

Each of vehicles 2 transmits registration data REG to data center 3 at a timing before execution of the restoration process (for example, a timing of factory shipment of vehicle 2). Registration data REG is data for registering information of vehicle 2 to data center 3. For example, registration data REG includes information regarding identification information (vehicle ID), vehicle type (model), and year model (manufacture year) of vehicle 2, as well as the model number of battery pack 10 mounted on vehicle 2. Registration data REG is stored in a database (not shown) provided in data center 3.

The traveling data (data H2) of vehicle 2 includes information regarding identification information of vehicle 2, a traveling condition during traveling of vehicle 2, driving tendency of the user of vehicle 2, and a state of battery pack 10 (degree of deterioration of battery pack 10). More specifically, examples of the traveling condition of vehicle 2 include a traveling time, a traveling path, a traveling distance, an external temperature during the traveling, and the like. Examples of the driving tendency of the user include speed, acceleration (and deceleration), lateral velocity, and the like of vehicle 2. The information regarding the driving tendency of the user may include a frequency of applying the brake (number of times of applying the brake per unit time).

Examples of the state of battery pack 10 include: temperature Tb of battery pack 10 during the traveling; and the charging/discharging history of battery pack 10; and the like. The information regarding the state of battery pack 10 may include information regarding passage of a period of time from the manufacture of vehicle 2 (or battery pack 10), for example. Instead of or in addition to the above-described information, an integration evaluation value $\Sigma D$ may be used as the information indicating the state of battery pack 10 (see WO 2013/046263). Integration evaluation value $\Sigma D$ is an index value indicating a degree of development of deterioration (so-called high-rate deterioration) of battery pack 10 due to battery pack 10 being continuously charged/discharged with a large amount of current.

Restoration data (data P2) of vehicle 2 includes: temperature Tb of battery pack 10 during execution of the restoration process; reference value X2 used for the restoration process; and information regarding capacity restoration ratio R of battery pack 10. Capacity restoration ratio R is a ratio (=C2/C1) of capacity C2 of battery pack 10 after the execution of the restoration process to capacity C1 of battery pack 10 before the execution of the restoration process.

Figure 7:
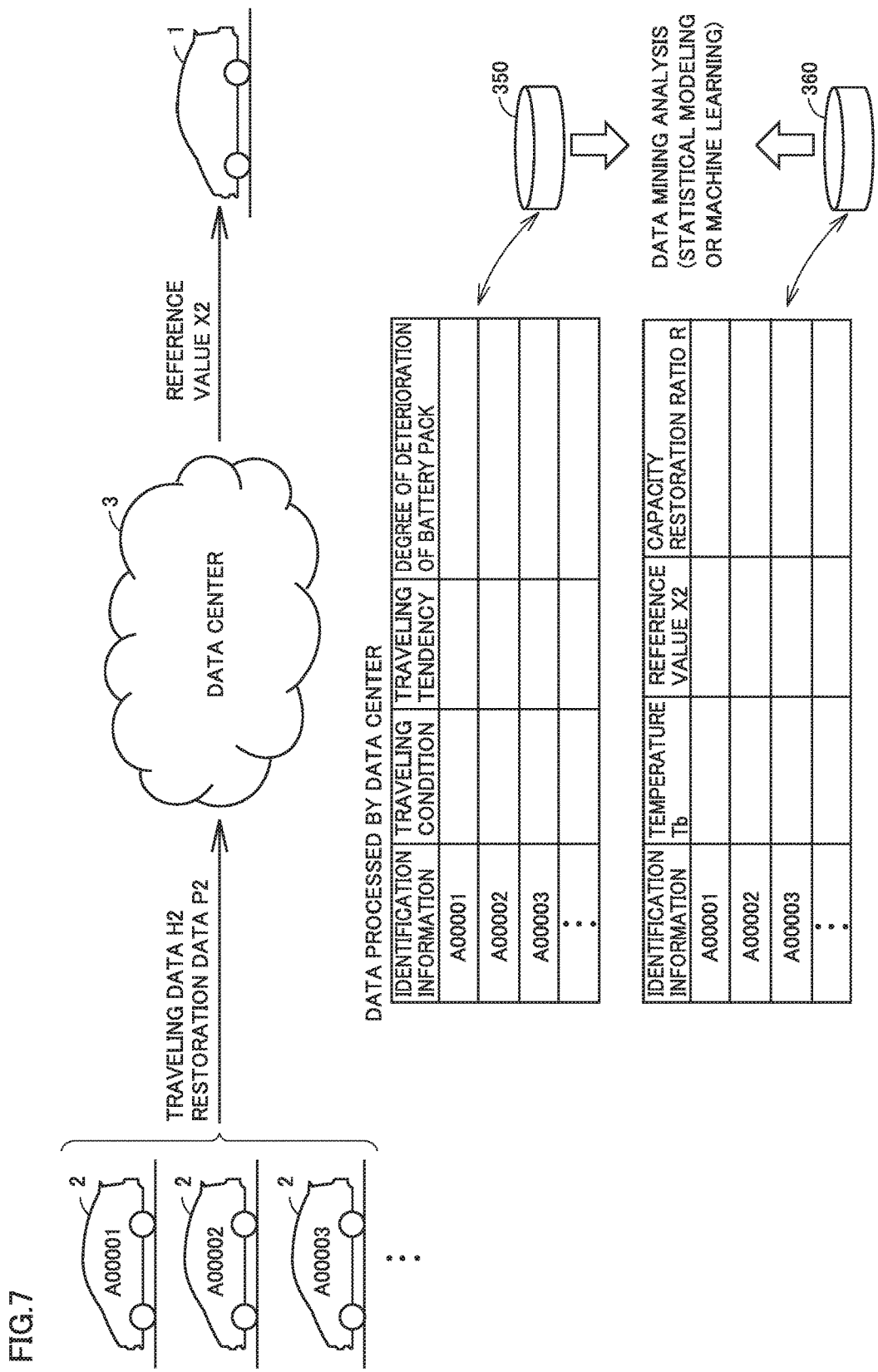
FIG. 7 is a conceptual view for illustrating a method of determining a reference value X2 in the first embodiment.

FIG. 7 is a conceptual view for illustrating a method of calculating reference value X2 in the first embodiment. During a normal operation of each of the plurality of vehicles 2 (while the restoration process is not performed), the traveling data (data H2) of each of vehicles 2 is collected and accumulated in data center 3. Although not shown in the figures, the traveling data (data H1) of vehicle 1 is also collected and accumulated in data center 3.

Data center 3 stratifies (classifies) all the accumulated data H1, H2, P1, P2 in accordance with the traveling conditions of vehicles 1, 2, the driving tendency of the user, and the degree of deterioration of battery pack 10 (see the processed data in FIG. 7, for example). Data center 3 applies a data mining technique (described below) to the stratified data (so-called big data) to analyze them and calculates reference value X2 to be used for the restoration process for vehicle 1.

In the above-described data mining analysis, data center 3 makes reference to registration data REG (see FIG. 6) to select data H2, P2 collected from vehicles 2 including battery packs 10 of the same type as battery pack 10 included in vehicle 1. Vehicles 2 corresponding to the data to be selected are preferably the same vehicle type of vehicles as that of vehicle 1, and are more preferably the same vehicle type and model year of vehicles as those of vehicle 1.

For example, data center 3 makes reference to the road map data stored in map database 310, whereby characteristics of regions in which vehicle 2 has traveled can be stratified based on the collected information regarding the traveling path. Examples of the characteristics of each of the regions include: whether the region is a cold region or a warm region; whether the region is a dry region or a humid region; whether the region is a high-altitude region or a low-altitude region; whether the region involves a large-slope geographical feature or a flat geographical feature; and the like. Moreover, data center 3 makes reference to the weather information acquired by weather information acquirer 330, whereby based on the information regarding the collected traveling path and traveling time, data center 3 can acquire the information regarding weather or the like of the traveling region during the traveling of vehicle 2.

The information regarding the acceleration, speed, lateral velocity, frequency of application of the brake, and the like of vehicle 2 in the traveling data is used to stratify the driving tendency of the user of vehicle 2. Whether or not the driving tendency of a certain user is similar to the driving tendency of a different user can be determined based on a frequency of appearance of a specific traveling pattern in which driving tendencies of users are likely to be reflected, for example. As one example, the vehicle of a user who likes to pass other vehicles often exhibits a traveling pattern such that the vehicle is accelerated from about 40 km/h to about 60 km/h and then travels at about 40 km/h again. Therefore, the driving tendencies of the users can be stratified in accordance with the frequency of appearance of such a traveling pattern.

During the execution of the restoration process for battery pack 10 mounted on vehicle 1, capacity restoration device 40 connected to vehicle 1 transmits, to data center 3, a request for calculating reference value X2 and the information regarding temperature Tb of battery pack 10. When the above-described request and information are received, data center 3 calculates reference value X2 suitable for the restoration process for battery pack 10 of vehicle 1 in accordance with the traveling history of vehicle 1 and temperature Tb of battery pack 10 of vehicle 1, based on the analysis result obtained by analyzing data H1, H2, P1, P2 using the data mining technique (the regularity obtained through the analysis). Reference value X2 suitable for the restoration process is preferably a value with which a capacity restoration amount $\Delta C$ (described below) of battery pack 10 is expected to be equal to or more than a predetermined amount. Reference value X2 calculated by data center 3 is transmitted to capacity restoration device 40. Capacity restoration device 40 performs the restoration process using reference value X2 from data center 3.

As the data mining technique for data H1, H2, P1, P2, the following known technique can be employed, for example. In data center 3, for example, clustering is performed using reference value X2 as an objective variable and other parameters as explanatory variables in accumulated data H1, H2, P1, P2, thereby finding a relation (or structure) between the explanatory variables. Then, a plurality of explanatory variables (inclusive of capacity restoration ratio R) to be used for calculation of reference value X2 are selected. Then, in order to predict how the objective variable (reference value X2) is changed when the selected explanatory variables are changed, data center 3 extracts a regularity established between the explanatory variable and the objective variable. The extracted regularity is represented as a predictive model or relational expression of the objective variable (statistical modeling). As one example, in the case where a regression analysis (for example, multiple regression analysis) is performed using a plurality of explanatory variables, a parameter of the predictive model used for the regression analysis is calculated through parameter fitting. It should be noted that from high-dimension data including a multiplicity of explanatory variables, the predictive model or relational expression may be derived by way of the statistical machine learning technique.

Figure 8:
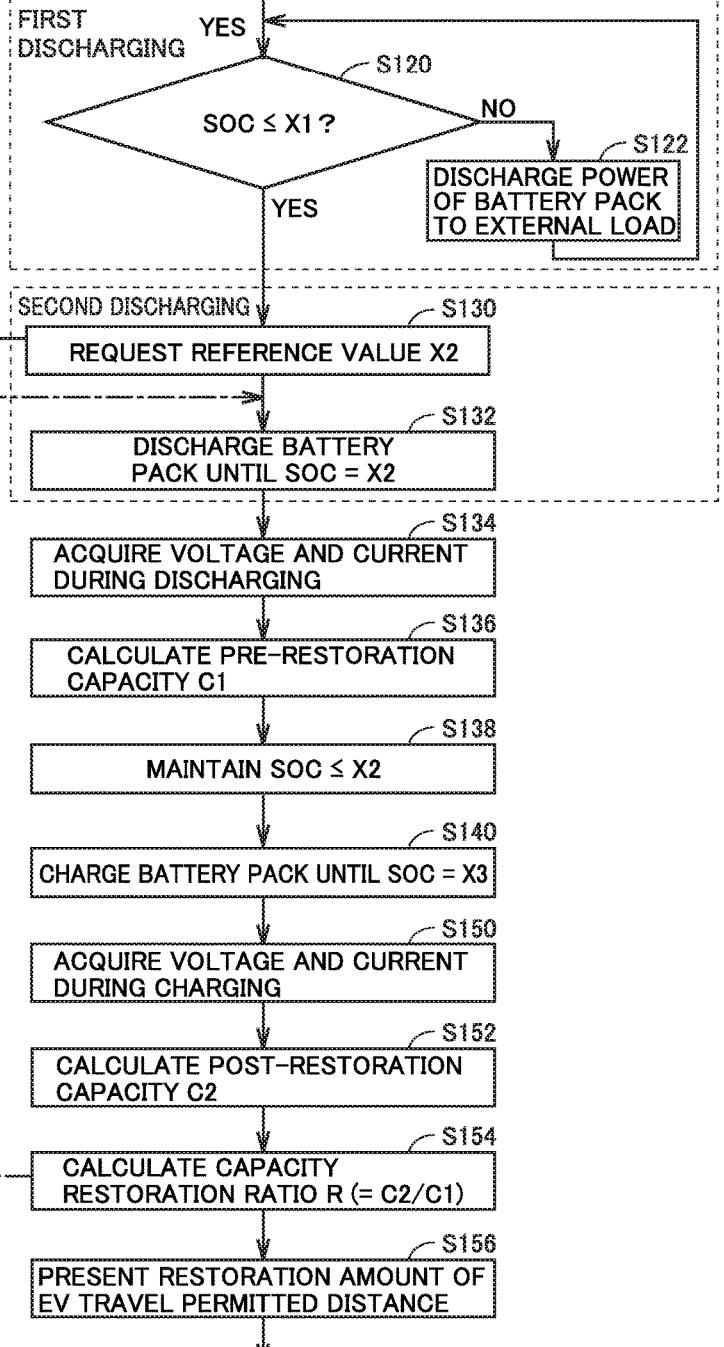
FIG. 8 is a flowchart showing the restoration process in the first embodiment.

FIG. 8 is a flowchart showing a restoration process in the first embodiment. The left-hand side of FIG. 8 represents a series of processes performed by server 300 of data center 3, and the right-hand side of FIG. 8 represents a series of processes performed by controller 400 of capacity restoration device 40. Each of steps (hereinafter, abbreviated as "S") included in the flowcharts is basically implemented by a software process by server 300 or controller 400; however, a part or the whole of the processes may be implemented by hardware (electric circuit) fabricated in server 300 or controller 400. Moreover, FIG. 8 shows processes performed by capacity restoration device 40 connected to vehicle 1; however, similar processes are performed by a capacity restoration device connected to a different vehicle 2. The series of processes shown in the right-hand side in FIG. 8 (as well as the series of processes shown in the right-hand side of the flowchart of FIG. 11 described below) are performed by, for example, the operator of the dealer operating start switch 410.

In S120, controller 400 determines whether or not the SOC of battery pack 10 is equal to or less than defined value X1. More specifically, for example, controller 400 acquires voltage Vb of each cell, and estimates the SOC of the whole of battery pack 10 based on voltage Vb using a correspondence relation between the previously determined voltage (more specifically, OCV (Open Circuit Voltage)) and the SOC.

When the SOC of battery pack 10 is higher than defined value X1 (NO in S120), controller 400 presents a message on display 430 to discharge battery pack 10. When the operator sees the message, the operator discharges power stored in battery pack 10 to external load 910 (S122). More specifically, the operator operates an external power feeding operation for supplying the power of battery pack 10 to outside the vehicle, thereby supplying external load 910 with the stored power from battery pack 10 via inlet 17 and power cable 171 due to the operation of power conversion device 18. Accordingly, battery pack 10 is discharged.

The processes of S120 and S122 correspond to the "first discharging process" shown in FIG. 5. During the execution of the first discharging process (and the execution of the second discharging process and the maintaining process), engine 14 is prohibited to be driven in order to avoid engine 14 from starting to generate power using motor generator 11. It should be noted that the discharging to external load 910 may be performed automatically by outputting a discharging command from controller 400 to ECU 100 of vehicle 1.

The discharging of battery pack 10 is continued until the SOC of battery pack 10 reaches defined value X1, and when the SOC of battery pack 10 becomes equal to or less than defined value X1 (YES in S120), the first discharging process is stopped and controller 400 forwards the process to S130.

In S130, controller 400 transmits, to data center 3, the request for calculating reference value X2 and the information regarding the restoration process condition (temperature Tb of battery pack 10). When the above-described request and information are received from controller 400, server 300 calculates reference value X2 to be used for the restoration process of battery pack 10 of vehicle 1 based on the analysis result obtained by analyzing data H1, H2, P1, P2 using the data mining technique and the restoration process condition (temperature Tb) of battery pack 10 of vehicle 1 (S190). Details of this calculation method have been described in FIG. 6 and FIG. 7 and will not be therefore described repeatedly.

In S132, controller 400 controls power converter 90 to discharge battery pack 10 until the SOC of battery pack 10 reaches reference value X2. More specifically, controller 400 estimates the SOC of each of cells 101 to 109 based on voltage Vb. Controller 400 starts discharging battery pack 10, and whenever the SOC of one of cells 101 to 109 reaches reference value X2, controller 400 closes a relay (one of relays 71 to 79) connected to the cell in parallel. Accordingly, only cell(s) having SOC(s) higher than reference value X2 are connected in series in battery pack 10, with the result that cell(s) having SOC(s) having reached reference value X2 are not discharged any more. Then, controller 400 ends discharging battery pack 10 when the SOCs of all the cells 101 to 109 have reached reference value X2. It should be noted that the processes of S130 and S132 correspond to the "second discharging process" shown in FIG. 5.

As such, in the second discharging process, even if there is a variation in SOC among cells 101 to 109, an amount of discharging can be adjusted for each cell, whereby the SOCs of all the cells 101 to 109 can be adjusted to reference value X2. On the other hand, since the discharging rate in the first discharging process is higher than that in the second discharging process, the SOC of the whole of battery pack 10 can be decreased quickly to defined value X1.

While battery pack 10 is being discharged by the second discharging process, controller 400 acquires voltage Vb of each cell and current Ib flowing in battery pack 10 (S134). Then, based on voltage Vb and current Ib during the discharging, controller 400 calculates a pre-restoration capacity C1 of battery pack 10 (S136). More specifically, controller 400 calculates SOCp and SOCq of each cell from voltage Vb, and calculates an integrated value ΣIb of current Ib during the discharging. SOCp is a SOC upon the start of the discharging in the second discharging process. SOCq is a SOC upon the end of the discharging. Then, controller 400 calculates the capacity of each cell using the following formula (1). By adding the capacities of all the cells, pre-restoration capacity C1 of battery pack 10 can be calculated.

$$C1 = \{\Sigma Ib/(SOCp - SOCq)\} \times 100 \qquad (1)$$

In S138, for period T, controller 400 maintains battery pack 10 to be in such a state that the SOC of battery pack 10 is equal to or less than reference value X2 (maintaining process). As period T (see FIG. 5), there can be used a value predetermined by the operator in consideration of a period of time during which vehicle 1 can be kept from the user, cost of keeping vehicle 1, and the like. Moreover, period T may be a value calculated in accordance with reference value X2 based on the data mining analysis result in order to increase the effect of the restoration process.

In S140, controller 400 controls power converter 90 to charge battery pack 10 until the SOC of battery pack 10 reaches defined value X3. It should be noted that the operator may change to connect inlet 17 to an external power supply (not shown), rather than external load 910, to charge battery pack 10 using power supplied from the external power supply via inlet 17.

While battery pack 10 is being charged in S140, controller 400 acquires voltage Vb of each cell and current Ib flowing in battery pack 10 (S150). Then, based on voltage Vb and current Ib during the charging, controller 400 calculates a post-restoration capacity C2 of battery pack 10 (S152). This calculation method is basically the same as the method of calculating pre-restoration capacity C1 although they are different in terms of charging and discharging, and therefore will not be described repeatedly.

In S154, controller 400 calculates capacity restoration ratio R (=C2/C1) attained by the restoration process, based on pre-restoration capacity C1 and post-restoration capacity C2 of battery pack 10. Controller 400 transmits calculated capacity restoration ratio R to data center 3. Instead of capacity restoration ratio R, a capacity restoration amount ΔC (=C2−C1), which is a difference between capacity C2 and capacity C1, may be transmitted to data center 3, for example. It should be noted that capacity restoration ratio R or capacity restoration amount ΔC correspond to a "capacity restoration amount" according to the present disclosure.

Server 300 associates temperature Tb of battery pack 10 received in S190, reference value X2 calculated in S190, and capacity restoration ratio R with one another, and stores them in restoration process database 360 as restoration data (data P1). Stored data P1 will be used to calculate a reference value X2 of a subsequent restoration process for vehicle 1 or other vehicles 2.

In S156, controller 400 calculates an EV traveling distance restoration amount (increased amount) of vehicle 1 based on capacity restoration amount ΔC, and presents the calculated restoration amount on display 430. The EV traveling distance restoration amount can be calculated from a product of capacity restoration amount ΔC and a power efficiency (EV traveling distance per unit consumption power amount) of vehicle 1. For the power efficiency of vehicle 1, it is preferable to use an actual value measured during normal traveling of vehicle 1; however, a fixed value (for example, catalog value) for the vehicle type of vehicle 1 may be used. For many users, the EV traveling distance is more easily understandable than the capacity of the battery pack. Hence, by converting the capacity restoration amount into the EV traveling distance, the operator can explain the effect of the restoration process to users in a more easily understandable manner.

As described above, according to the first embodiment, for the restoration process to vehicle 1 serving as a target vehicle, reference value X2 to be used is calculated using traveling data (data H1, H2) accumulated in traveling history database 350 of data center 3 and restoration data (data P1, P2) accumulated in restoration process database 360. Due to restriction in development schedule, cost, and the like, the capacity restoration test can be performed under limited conditions, such as several ten to several hundred conditions. In contrast, the data (big data) collected from a multiplicity of vehicles 2 (for example, several thousands to several ten thousands) under various conditions are accumulated in traveling history database 350 and restoration process database 360. By applying a data mining analysis technique to the data, more appropriate reference value X2 can be calculated in accordance with a degree of deterioration of battery pack 10 mounted on vehicle 1 (for example, the charging/discharging history of battery pack 10, passage of time from the manufacture of battery pack 10, or integration evaluation value ΣD) and the restoration process condition (temperature Tb). Therefore, the capacity of battery pack 10 of vehicle 1 can be restored effectively.

It should be noted that in the first embodiment, it has been illustrated that each of vehicle 1 and the plurality of vehicles 2 is a plug-in hybrid vehicle; however, each of vehicle 1 and the plurality of vehicles 2 may be an electric vehicle.

Moreover, in the first embodiment, it has been illustrated that the traveling data (data H1, H2) of vehicle 1 and the plurality of vehicles 2 are accumulated in data center 3; however, the accumulation of data H1, H2 is not essential and only the restoration data (data P1, P2) may be accumulated in data center 3. Server 300 employs the data mining analysis to extract a regularity established between reference value X2 and capacity restoration ratio R in data P1, P2, and calculates reference value X2 to maximize capacity restoration ratio R. In this case, the state (degree of development of deterioration) of battery pack 10 is not taken into consideration. Accordingly, reference value X2 is less likely to be an optimum value as compared with a case where all the data H1, H2, P1, P2 are accumulated. On the other hand, the data mining analysis can be performed more readily, thus simplifying the configuration of data center 3.

Further, it has been illustrated that data H1, H2, P1, P2 are accumulated in data center 3 and reference value X2 is calculated by server 300; however, reference value X2 may be calculated on each of vehicles 1, 2. For example, in the case where only data P1, P2 are accumulated in data center 3, required data (data of the same vehicle type of vehicle as vehicle 1) of data P1, P2 are transmitted from data center 3 to vehicle 1 in performing the restoration process to vehicle 1, and reference value X2 can be calculated on vehicle 1 (for example, by capacity restoration device 40 or ECU 100). In this case, capacity restoration device 40 or ECU 100 corresponds to a "calculation device" according to the present disclosure.

Second Embodiment

In the first embodiment, it has been illustrated that the restoration process for the battery pack mounted on the plug-in hybrid vehicle or electric vehicle is performed in the dealer's workplace, in other words, it has been illustrated that the restoration process for the vehicle that can be externally supplied with power is performed in a specific location. In a second embodiment, it will be illustrated that the restoration process can be performed in any location for a hybrid vehicle that is not capable of supplying power of the battery pack to outside the vehicle.

FIG. 9 shows a configuration of a capacity restoration system 9A in the second embodiment. A vehicle 1A is a hybrid vehicle, and is different from vehicle 1 (see FIG. 2) in the first embodiment in that: vehicle 1A does not include inlet 17 and power conversion device 18; and a capacity restoration device 40A is mounted on vehicle 1A. A load 940 is connected to capacity restoration device 40A but external power supply 920 (see FIG. 2) is not connected thereto. Each configuration of the plurality of vehicles 2A is the same as the configuration of vehicle 1. The other configurations of capacity restoration system 9A are the same as the corresponding configurations of capacity restoration system 9 according to the first embodiment, and therefore will not be repeatedly described.

FIG. 10 is a time chart for illustrating a restoration process in the second embodiment. During normal traveling of vehicle 1A until a time t21, the SOC of battery pack 10 is maintained to fall within a predetermined range M (for example, in a range of SOC=40% to 60%).

At time t21, vehicle 1A is parked at, for example, the user's house, and start switch 410 is operated by the user. Accordingly, a command is output from controller 400 to ECU 100 of vehicle 1 to discharge battery pack 10, thereby performing the discharging process (first discharging process) for battery pack 10. Specifically, the power of battery pack 10 is consumed by operating air conditioning device 16 and turning on a headlight (not shown) with engine 14 being non-operational and motor generator 11 being prohibited to generate power.

The subsequent processes from time t22 to time t24 (second discharging process and maintaining process) are basically the same as the processes from time t12 to time t14 in the first embodiment (see FIG. 5) and therefore will not be described repeatedly.

At time t24, it is assumed that period T has passed and the restoration of the capacity of battery pack 10 has been completed, and then battery pack 10 starts to be charged. That is, engine 14 is started and battery pack 10 is charged using power generated by motor generator 11 using motive power of engine 14. This charging is performed until the SOC of battery pack 10 falls within range M (time t25). Then, the user starts traveling of vehicle 1A again.

FIG. 11 is a flowchart showing the restoration process in the second embodiment. This flowchart differs from the flowchart (see FIG. 8) in the first embodiment in that S222 and S240 are included instead of S122 and S140.

When the SOC of battery pack 10 is >X1 in S220 (NO in S220), the power stored in battery pack 10 is consumed in vehicle 1 in S222 by operating air conditioning device 16 and turning on the headlight (not shown). It should be noted that a type of device to be operated is not particularly limited as long as the power of battery pack 10 can be consumed.

When the maintaining process in S238 is completed, motor generator 11 generates electric power using motive power of engine 14 in vehicle 1 in S240 until the SOC of battery pack 10 falls within range M. Battery pack 10 is charged with the generated electric power. Then, capacity restoration ratio R is transmitted to data center 3 (S292), and the EV traveling distance restoration amount is presented on display 430. The EV traveling distance restoration amount may be presented on a navigation screen (not shown) of navigation system 110 instead of display 430.

The other processes (processes of S220, S230 to S238, S256, S290, and S292) in the flowchart shown in FIG. 11 are the same as the corresponding processes in the flowchart in the first embodiment (namely, the processes of S120, S130 to S138, S156, S190, and S192), and therefore will not be described in detail.

As described above, according to the second embodiment, by applying the data mining analysis technique to the big data in the same manner as in the first embodiment, appropriate reference value X2 can be calculated in accordance with the degree of deterioration of battery pack 10 mounted on vehicle 1A and the restoration process condition. Therefore, the capacity of battery pack 10 of vehicle 1A can be restored effectively.

Further, the power stored in battery pack 10 in vehicle 1A cannot be discharged to outside the vehicle; however, the power of battery pack 10 is consumed by operating a device such as air conditioning device 16, thereby decreasing the SOC of battery pack 10 to reference value X2. Moreover, by charging battery pack 10 with the electric power generated by motor generator 11, the state of vehicle 1A can be returned to the state suitable for traveling after performing the restoration process. Therefore, the restoration process can be performed at any location.

It should be noted that in the second embodiment, it has been illustrated that each of vehicle 1A and the plurality of vehicles 2A is a hybrid vehicle; however, each of vehicle 1A and the plurality of vehicles 2A may be another electrically powered vehicle (namely, a plug-in hybrid vehicle or fuel cell vehicle) capable of generating power.

Modification of First and Second Embodiments

In each of the first and second embodiments, it has been illustrated that the restoration process is started when the operator of the dealer or the user of vehicle 1 operates start switch 410. However, in some state or environment of battery pack 10, sufficient restoration effect is not attained even when the restoration process is performed and the capacity deterioration may become noticeable due to battery pack 10 being maintained in the low SOC state for a long period of time. Therefore, in the modification of the first and second embodiments, the following describes a configuration in which an inquiry is made from capacity restoration device 40 (or 40A) to data center 3 as to whether or not a condition (start condition) for starting the restoration process is satisfied.

Figure 12:
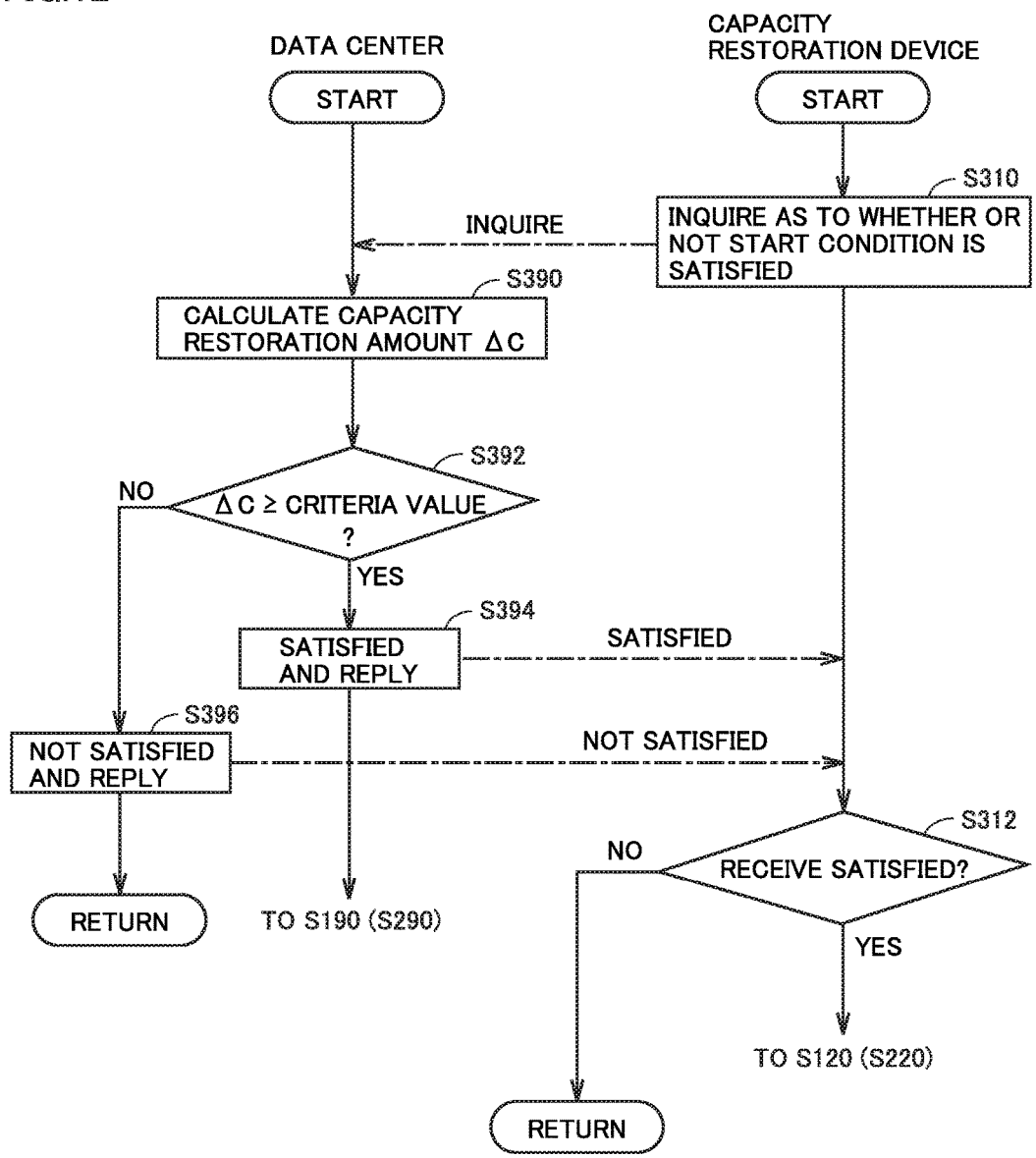
FIG. 12 is a flowchart showing the restoration process in a modification of the first and second embodiments.

FIG. 12 is a flowchart showing the restoration process in the modification of the first and second embodiments. The process shown in this flowchart is invoked and performed in a predetermined cycle or when a predetermined condition is satisfied (for example, when capacity restoration device 40 is powered on).

In S310, for example, when start switch 410 is operated, controller 400 of capacity restoration device 40 makes an inquiry to server 300 of data center 3 as to whether or not the start condition is satisfied. More specifically, upon making the above-described inquiry, controller 400 transmits, to data center 3, the identification information of vehicle 1 and temperature Tb of battery pack 10.

For example, when deterioration of battery pack 10 is not developed in the first place, the restoration process does not need to be performed, and sufficient capacity restoration amount ΔC cannot be obtained even when the restoration process is performed. Moreover, also when temperature Tb of battery pack 10 is too low (for example, when temperature Tb is 0° C. or less), sufficient capacity restoration amount ΔC cannot be obtained even when the restoration process is performed (see Japanese Patent Laying-Open No. 2012-195161).

In S390, server 300 calculates most suitable reference value X2 in accordance with data H1 and temperature Tb of battery pack 10 of vehicle 1 based on the analysis result (regularity) obtained by analyzing accumulated data H1, H2, P1, P2 using the data mining technique. Further, server 300 employs the above-described regularity to predict capacity restoration ratio R to be achieved when using calculated reference value X2. Then, server 300 determines whether or not the start condition is satisfied by determining whether or not the predicted value of capacity restoration ratio R is equal to or more than a criteria value (criteria amount).

When predicted capacity restoration ratio R is equal to or more than the criteria value (YES in S392), server 300 determines that the start condition is satisfied, and replies this to capacity restoration device 40 (S394). Then, the process is forwarded to S190 (see FIG. 8) or S290 (see FIG. 11). On the other hand, when the predicted value of capacity restoration ratio R is less than the criteria value (NO in S392), server 300 determines that the start condition is not satisfied, and replies this to capacity restoration device 40 (S396). Then, the process is brought back to the main routine.

In S312, controller 400 determines whether or not the reply indicating that the start condition is satisfied is received from data center 3. When it is determined that the start condition is satisfied (YES in S312), controller 400 forwards the process to S120 (or S220) to start the first discharging process, thereby performing the restoration process. On the other hand, when it is determined that the start condition is not satisfied (NO in S312), controller 400 returns the process to the main routine without performing the first discharging process (namely, without performing the restoration process).

As described above, according to the modification of the first and second embodiments, when it is predicted that no sufficient restoration effect is to be attained even if the restoration process is performed, it is determined that the start condition is not satisfied and the restoration process is suppressed from being performed. On the other hand, when it is predicted that a sufficient restoration effect is to be attained, it is determined that the start condition is satisfied and the restoration process is performed. Whether or not such a start condition is satisfied is determined based on the result of the analysis employing data mining, whereby highly precise determination can be attained. Accordingly, the restoration process can be performed at a more appropriate timing.

Although the present disclosure has been described and illustrated in detail, it is clearly understood that the same is by way of illustration and example only and is not to be taken by way of limitation, the scope being interpreted by the terms of the appended claims.

What is claimed is:

1. A lithium ion secondary battery capacity restoration system for restoring a capacity of a battery pack including lithium ion secondary batteries and mounted on a first vehicle, the lithium ion secondary battery capacity restoration system comprising:
 a capacity restoration device configured to perform a restoration process to restore a capacity of the battery pack of the first vehicle by maintaining a state of charge (SOC) of the battery pack to be equal to or less than a reference SOC;
 a data acquisition device configured to acquire restoration data from a plurality of vehicles including the first vehicle, the restoration data including the reference SOC used for the restoration process and a capacity restoration amount attained by the restoration process; and
 a calculation device configured to calculate a target reference SOC for a second vehicle using the restoration data, the target reference SOC being a second reference SOC to be used for the restoration process for the second vehicle.

2. The lithium ion secondary battery capacity restoration system according to claim 1, wherein
 the data acquisition device is further configured to acquire a traveling history of each of the plurality of vehicles and a temperature of the battery pack during execution of the restoration process, and
 the calculation device is configured to calculate the target reference SOC using the traveling history of each of the plurality of vehicles and the temperature of the battery pack in addition to the restoration data.

3. The lithium ion secondary battery capacity restoration system according to claim 2, wherein the calculation device is configured to extract a regularity established among the traveling history of each of the plurality of vehicles, the temperature of the battery pack, the reference SOC, and the capacity restoration amount, and is configured to calculate the target reference SOC according to the traveling history of the second vehicle and the temperature of the battery pack of the second vehicle based on the extracted regularity.

4. The lithium ion secondary battery capacity restoration system according to claim 1, wherein the calculation device is configured to calculate the target reference SOC such that the capacity restoration amount after the execution of the restoration process becomes equal to or more than a predetermined amount.

5. The lithium ion secondary battery capacity restoration system according to claim 1, wherein
 the calculation device is configured to use the restoration data to predict the capacity restoration amount to be attained when the restoration process is performed to the second vehicle, and
 the capacity restoration device is configured to perform the restoration process to the second vehicle when the predicted capacity restoration amount is equal to or more than a criteria amount, and is configured not to perform the restoration process to the second vehicle when the predicted capacity restoration amount is less than the criteria amount.

6. The lithium ion secondary battery capacity restoration system according to claim 2, wherein the traveling history of each of the plurality of vehicles includes at least one of a traveling path, a traveling distance, and speed and acceleration of each of the plurality of vehicles.

7. The lithium ion secondary battery capacity restoration system according to claim 1, wherein the data acquisition device and the calculation device are provided in a data center external to the plurality of vehicles.

8. The lithium ion secondary battery capacity restoration system according to claim 1, further comprising a notifier mounted on the second vehicle, the notifier being configured to notify the capacity restoration amount after the execution of the restoration process to a user of the second vehicle.

9. A lithium ion secondary battery capacity restoration system for restoring a capacity of a battery pack including lithium ion secondary batteries and mounted on a first vehicle, the lithium ion secondary battery capacity restoration system comprising:
 an electrical discharge circuit configured to discharge the battery pack and perform a restoration process to restore a capacity of the battery pack of the first vehicle by maintaining a state of charge (SOC) of the battery pack to be equal to or less than a reference SOC;
 a controller configured to control the electrical discharge circuit; and
 a server configured to acquire restoration data from a plurality of vehicles including the first vehicle, the restoration data including the reference SOC used for the restoration process and a capacity restoration amount attained by the restoration process, wherein the server is further configured to calculate a target reference SOC for a second vehicle using the restoration data, the target reference SOC being a second reference SOC to be used for the restoration process for the second vehicle.

* * * * *